United States Patent [19]

Buchan

[11] Patent Number: 4,833,398

[45] Date of Patent: May 23, 1989

[54] ELECTRIC WATER HEATER ANALYZER

[76] Inventor: Robert E. Buchan, c/o Arthur G. Yeager, P.A. Suite 1305, 112 W. Adams St., Jeffersonville, Fla. 32202-3853

[21] Appl. No.: 257,193

[22] Filed: Oct. 12, 1988

Related U.S. Application Data

[63] Continuation of Ser. No. 919,374, Oct. 16, 1986, abandoned.

[51] Int. Cl.[4] .................... G01R 19/145; G01R 31/00
[52] U.S. Cl. .................... 324/73 R; 324/549; 324/505; 324/547; 219/509
[58] Field of Search .................... 324/73 R, 512, 529, 324/522, 547, 549, 505; 219/509, 506, 497, 494, 322, 554; 340/640, 641, 642, 650, 651, 663, 664

[56] References Cited

U.S. PATENT DOCUMENTS

| | | | |
|---|---|---|---|
| 396,582 | 1/1889 | Loomis | 340/651 |
| 428,050 | 5/1890 | Macloskie | 340/650 |
| 2,567,859 | 9/1951 | Ringo | 324/549 |
| 2,805,391 | 9/1957 | Meadows et al. | 324/73 R |
| 2,980,898 | 4/1961 | Mason et al. | 324/73 R |
| 3,744,046 | 7/1973 | Tamasi | 340/640 |
| 4,127,854 | 11/1978 | Gardner et al. | 340/664 |
| 4,382,225 | 5/1983 | Peltz | 324/73 R |
| 4,430,554 | 2/1984 | Fleischmann | 219/322 |
| 4,467,178 | 8/1984 | Swindle | 219/506 |
| 4,496,940 | 1/1985 | Christel, Jr. | 340/640 |
| 4,558,306 | 12/1985 | Freliech | 340/663 |
| 4,678,892 | 7/1987 | Finger et al. | 219/332 |
| 4,698,583 | 10/1987 | Sandberg | 219/509 |
| 4,705,930 | 11/1987 | Sathre, Jr. et al. | 219/494 |

FOREIGN PATENT DOCUMENTS

| | | | |
|---|---|---|---|
| 0653489 | 11/1937 | Fed. Rep. of Germany | 340/640 |
| 1563630 | 1/1970 | Fed. Rep. of Germany | 340/640 |

OTHER PUBLICATIONS

"Detecting Short Circuits During Assembly", by Ames Research, NASA Tech. Briefs, Spring '80, vol. 5, #1, pp. 9–10.

"Thermal Bonder Heater Sensor", by Dugas, Tech. Digest of West. Elec., #42, pp. 9–10.

Primary Examiner—Reinhard J. Eisenzopf
Assistant Examiner—W. Burns

[57] ABSTRACT

An electric testing system to be attached to a water heater to permit instantaneous testing of the operability of each heating element comprising a separate branch circuit including each heating element and a current flow detecting device.

9 Claims, 1 Drawing Sheet

ELECTRIC WATER HEATER ANALYZER

This is a continuation of co-pending application Ser. No. 919,374, filed on Oct. 16, 1986, now abandoned.

BACKGROUND OF THE INVENTION

Electric water heaters for family residences generally include two heating elements each of which is controlled by a separate thermostat which turns the heating element on when the water temperature is below a selected level, e.g. 100° F., and turns the element off when the water temperature reaches an upper selected level, e.g. 130° F. One element is located in the upper portion of the water reservoir and the other in the lower portion of the water reservoir. Cold water is fed into the bottom of the reservoir and hot water leaves from the top of the reservoir.

In the normal operation the two elements are joined in a circuit in which the upper element is used first in order to maintain a supply of hot water in the upper portion of the reservoir, and when the upper thermostat senses the temperature of 130° F. it turns off the upper element and closes the circuit including the lower element which heats the water in the lower portion of the reservoir. As hot water is used the lower element is turned on to heat the incoming cold water, with the result that the lower element is turned on and off many more times than the upper element and thereby is more likely to burn out sooner than the upper element. When it does burn out, the upper element assumes all of the heating load and the owner rarely knows that the lower element is not functioning until both elements are burned out. In the meantime there may be a considerable waste of power by shorting of the lower element which is costly to the homeowner.

It is an object of this invention to provide a system for testing the operability of heating elements in a water heater. It is another object of this invention to provide such a system that is easily used by anyone, young or old, blind, or deaf. Still other objects will become apparent from the more detailed description which follows.

BRIEF SUMMARY OF THE INVENTION

This invention relates to a system for separately testing the operability of each heating element in an electric water heater comprising a main circuit and two branch circuits, said main circuit including the upper heating element and the lower heating element of an electric water heater with a thermostat controlled switch for each said element to open or close said main circuit to each said element respectively in accord with the temperature of the water being heated by that element; a first branch circuit in series with said upper heating element and including current flow detecting means, a second branch circuit in series with said lower heating element and including current flow detecting means, switch means in each of said three circuits adapted to assume either of two combinations, the first combination including opening said main circuit and closing said first and second branch circuits, and the second combination including closing said main circuit and opening said first and second branch circuits.

In one specific embodiment of this invention the switch means is a push button which normally leaves the main circuit closed and the two branch circuits open, but when pushed, the main circuit is opened and the branch circuits are closed. In another specific embodiment the current flow detecting means is a light or a receptable for an electric appliance.

BRIEF DESCRIPTION OF THE DRAWINGS

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawings in which:

DETAILED DESCRIPTION OF THE INVENTION

Figure 1:
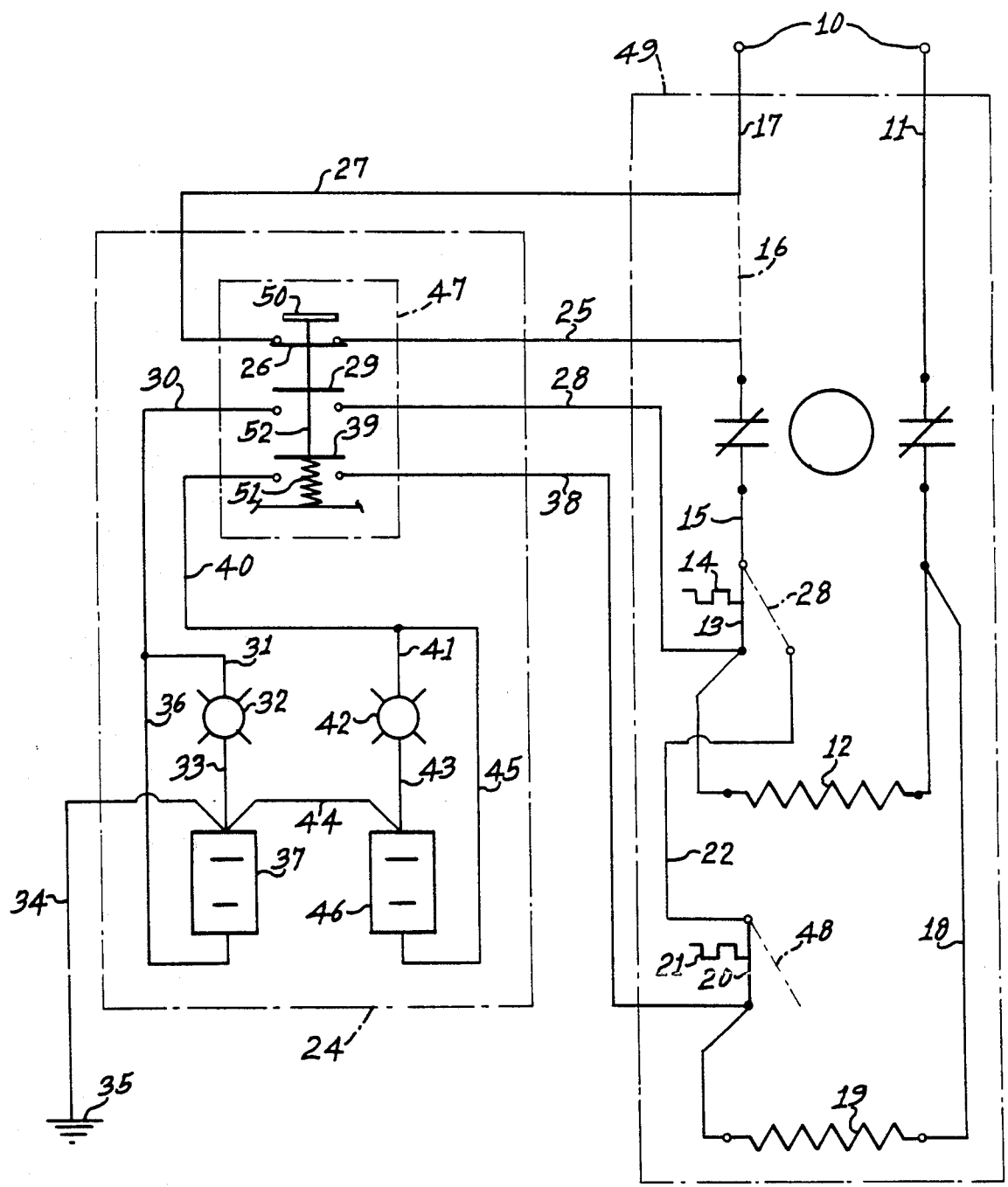
FIG. 1 is a schematic electric circuit diagram of the system of this invention as applied to an electric water heater.

By reference to the accompanying drawing the system of this invention can be understood. The circuitry of the normal water heater is illustrated at 49. Terminals 10 are connected to a source of power (not shown here) preferably 240 volts. Line 11 is connected from one terminal 10 to one side of upper heating element 12, and the other end of element 12 is connected through lines 15, 16, and 17 to the other terminal 10. Included in this circuit is a switch 13 operatively connected to a thermostat 14. When thermostat 13 is at a low temperature switch 13 is closed (as shown in solid lines) and current passes through element 12 causing it to heat water in the upper portion of the water reservoir of the heater. When thermostat 14 is at a high temperature it opens switch 13 to the position 23 (as shown in dotted lines) breaking the circuit and not permitting current to flow through upper heating element 12. Usually thermostat 13 is set to keep switch closed until a temperature of about 130° F. is reached, at which point switch 13 is opened.

A second circuit in the water heater 49 begins at one terminal 10 and continues through lines 11 and 18 to lower heating element 19 and then through switch 20, line 22, switch 13, and lines 15, 16, and 17 to the other terminal 10. This circuit is closed only when switch 13 is in the open position 23 and when switch 20 is closed. Generally this occurs when upper heating element has raised the water temperature to 130° F. causing switch 13 to be opened to 23 position by thermostat 14. Then lower heating element 19 is turned on and heats the water in the lower part of the water reservoir until it is hot enough for thermostat 21 to push switch 20 its open position 48 (shown in dotted lines). The temperature at which this occurs is normally 130° F., the same as it is for upper thermostat 14 and switch 13. Cold water in a heater usually enters the bottom of the heater and hot water leaves from the top. It, therefore, is of primary importance to have hot water in the top since that is where it is drawn off for use.

In the unimproved commercial water heater the return line 15, 16, and 17 is an uninterrupted line. In this drawing line 16 is shown in dotted lines because it is not present in the improved system of this invention. Line 15 connects to line 25 and passes through switch 26 (which is closed in this drawing) and through line 27 to line 17 and to the terminal 10. The main circuit of this invention, therefore, starts at terminal 10, passes through line 11 to element 12 or line 11 and 18 to element 19 and then returns through switch 13 or switch 20 to lines 15 and 25, switch 26 and lines 27 and 17 to terminal 10. The alternate functioning of heating elements 12 and 19 is not changed by this invention. The only change is to divert return line 15, 16, 17 to let it pass through switch 26.

The features of this invention are found within test unit 24, which principally includes two branch circuits, one for each of upper heating element 12 and lower heating element 19. The branch circuit for upper heating element 12 begins at switch 13 passes through line 28, switch 29, and line 30 to either or both of two current flow detectors. Line 31 leads through neon light 32 to line 33. Line 36 leads to receptacle 37. The outlet of line 33 and of receptacle 37 is line 34 which leads to a ground connection 35. Receptacle 37 is provided so that any small electrical appliance, e.g. a fan, heater, a hair dryer, or the like, could be attached and would operate a current passed through the circuit. If a person could not detect light 32 because he was blind he could use a hair dryer and tell if it were operating.

A similar branch circuit is connected to lower heating element 19. This circuit starts at switch 20 and passes through line 38 to switch 39 to line 40 and takes either route through line 41, neon light 42 and line 43 or through line 45 and receptacle 46 to line 44 and line 34 to ground connection 35.

A preferred feature of this invention is found in switch means 47. This includes the combined simultaneous operation of switches 26, 29 and 39. In this instance switches 26, 29, and 39 are ganged together by a common connector 52, a push button 50, and a spring 51. The normal position of these switches is as shown in the drawing wherein the main circuit to elements 12 and 19 is closed by switch 26 and both branch circuits through switch 29 and 39 are open. Spring 51 is biased to maintain this normal position. When push button 50 is pressed down, the main circuit is opened and both branch circuits are closed. This is the test position which shows whether elements 12 and 19 are operable or burned out. If operable, lights 32 and 42 will be on, or appliances plugged into receptables 37 and 46 will be on. If either or both of elements 12 and 19 are burned out the respective light 32 or 42 or receptable 37 or 46 will be off. Release of pressure on button 50 allows the circuits to return to the normal operating position shown in the drawings.

By slight modification of the circuits the same improvement can be applied to a water heater having more than two elements. It merely requires a branch circuit for each element.

While the invention has been described with respect to certain specific embodiments, it will be appreciated that many modifications and changes may be made by those skilled in the art without departing from the spirit of the invention. It is intended, therefore, by the appended claims to cover all such modifications and changes as fall within the true spirit and scope of the invention.

What is claimed as new and what is desired to secure by Letters Patent of the United States is:

1. A system for separately testing the operation of each of at least two heating elements in an electric water heater containing an upper heating element and a lower heating element comprising a main circuit and two branch circuits, said main circuit including said upper heating element and said lower heating element of said electric water heater and a pair of thermostat controlled switches for respective said heating elements selectively opening and closing said main circuit to respective said element in accord with the temperature of the water being heated by respective said heating element, a first branch circuit bypassing one said thermostat switch and in series with said upper heating element and including a first current flow indicator, a second branch circuit bypassing another said thermostat switch and in series with said lower heating element and including a second current flow indicator, switch means in each of said main and branch circuits for providing momentary opening of said main circuit and closing said first and second branch circuits to a first condition to test current flow through said heating elements, said switch means, excepting the momentary opening, closing said main circuit and opening said first and second branch circuits to a second condition to permit normal operation of said water heater by said main circuit.

2. The system of claim 1 wherein said switch means comprises a single two-position switch in each of said master and branch circuits and operating means for simultaneously moving said two-position switches between said first and second conditions.

3. The system of claim 2 wherein said operating means is a spring biased push button which when not depressed causes said switch means to be in said second condition, and when manually depressed causes said switch means to be in said first condition.

4. The system of claim 1 wherein each said first and second indicator includes a light which illuminates when current is flowing through respective said branch circuit and turns off when respective said branch circuit opens.

5. The system of claim 1 wherein each said first and second indicator includes a female receptacle into which an appliance may be plugged, said female receptacle receiving power only when current is flowing in respective said branch circuit during testing of respective said heating element and receiving no power when respective said branch circuit is open including when respective said heating element is incapable of passing sufficient current to power an appliance which may be plugged into respective said female receptacle.

6. The system of claim 1 wherein said switch means includes three switches respectively in said main circuit and said branch circuits, said switch in said main circuit being normally closed to permit normal operation of said water heater, said switch in each said branch circuit being normally open with its respective indicator being impowered, said switch means having a spring biased operator for simultaneously moving all said switches together to momentarily open said switch in said main circuit and closing said switches in said branch circuits so that said first and second indicators will be powered by current flow through said heating elements if said heating elements pass current therethrough.

7. The system of claim 6 wherein said branch circuits bypass said thermostat controlled switches in said main circuit controlling the normal supply of current to respective said heating elements so that said heating elements may be energized or not energized prior to momentary testing thereof by said switch means.

8. The system of claim 7 wherein each of said first and second indicator includes a light which illuminates when current flows through respective said first and second branch circuits and a female receptacle into which an appliance may be connected by a male plug.

9. The system of claim 7 wherein respective said light and said female receptacle are connected in series in respective said first and second branch circuits.

* * * * *